United States Patent
Tamura et al.

(10) Patent No.: US 7,119,533 B2
(45) Date of Patent: Oct. 10, 2006

(54) METHOD, SYSTEM AND DEVICE FOR CALIBRATING A MAGNETIC FIELD SENSOR

(75) Inventors: Yasuhiro Tamura, Saitama (JP); Masahito Ito, Saitama (JP)

(73) Assignee: C & N, Inc., Tokyo (JP)

( * ) Notice: Subject to any disclaimer, the term of this patent is extended or adjusted under 35 U.S.C. 154(b) by 0 days.

(21) Appl. No.: 11/109,819

(22) Filed: Apr. 20, 2005

(65) Prior Publication Data

US 2006/0066295 A1    Mar. 30, 2006

Related U.S. Application Data

(63) Continuation of application No. PCT/JP04/14272, filed on Sep. 29, 2004.

(51) Int. Cl.
*G01R 35/00* (2006.01)
*G01R 33/02* (2006.01)

(52) U.S. Cl. ............... 324/202; 324/247; 324/260; 701/224; 702/92; 33/355 R

(58) Field of Classification Search ........... 324/202, 324/249, 251, 252, 247, 260; 33/355 R, 33/361, 356; 702/150, 92–93; 701/224
See application file for complete search history.

(56) References Cited

U.S. PATENT DOCUMENTS

| | | | | |
|---|---|---|---|---|
| 4,497,034 A | * | 1/1985 | Kuno et al. ............... | 702/92 |
| 6,536,123 B1 | * | 3/2003 | Tamura ..................... | 33/356 |
| 2004/0254727 A1 | * | 12/2004 | Ockerse et al. ............ | 701/224 |
| 2005/0256673 A1 | * | 11/2005 | Hikida et al. .............. | 702/150 |

FOREIGN PATENT DOCUMENTS

| | | |
|---|---|---|
| JP | 03-293516 | 12/1991 |
| JP | 2004-012416 | 1/2004 |
| JP | 2004-309227 | 11/2004 |
| JP | 2004-309228 | 11/2004 |

OTHER PUBLICATIONS

English Abstract of JP Application, 2003-100689, Publication No. 2004-309228, Nov. 4, 2004, Patent Abstracts of Japan, Japanese Patent Office Website.

(Continued)

*Primary Examiner*—Jay M. Patidar

(57) ABSTRACT

A control device 200 calibrates a magnetic-field sensor 100 by computation. A computation unit 210 calculates the magnetic-field intensity based upon the outputs of X-axis, Y-axis, and Z-axis magnetic-field detection devices of the magnetic-field sensor 100. Such calculation is performed for four or more different points. The calculation is performed such that at least one point is not positioned on a plane including the other points. The computation unit 210 converts the outputs from the X-axis, Y-axis, and Z-axis magnetic-field detection devices of the magnetic-field sensor 100 into three-dimensional spatial coordinate points. Then, the computation unit 210 creates a sphere on which the four or more coordinate points thus obtained are positioned. The coordinate point of the center of the sphere thus created represents the magnetic-field offset. The interfering magnetic-field components in the X-axis, Y-axis, and Z-axis directions thus obtained are subtracted from the outputs of the X-axis, Y-axis, and Z-axis magnetic-field detection devices of the magnetic sensor 100, whereby calibration is made.

4 Claims, 5 Drawing Sheets

OTHER PUBLICATIONS

English Abstract of JP Application, 2003-100688, Publication No. 2004-309227, Nov. 4, 2004, Patent Abstracts of Japan, Japanese Patent Office Website.

English Abstract of JP Application, 02-097107, Publication No. 03-293516, Dec. 25, 1991, Patent Abstracts of Japan, Japanese Patent Office Website.

English Abstract of JP Application, 2002-16991, Publication No. 2004-012416, Jan. 15, 2004, Patent Abstracts of Japan, Japanese Patent Office Website.

International Search Report for PCT/JP2004/014272, Jan. 11, 2005, ISA/JP, Japan Patent Office.

* cited by examiner

METHOD, SYSTEM AND DEVICE FOR CALIBRATING A MAGNETIC FIELD SENSOR

CROSS-REFERENCE TO RELATED APPLICATIONS

This is a continuation of International Application PCT/JP04/14272, filed Sep. 29, 2004.

BACKGROUND OF THE INVENTION

1. Field of the Invention

The present invention relates to a control method for performing calibration of a magnetic-field sensor for detecting the terrestrial magnetic field and so forth, and a control device and a mobile terminal device.

2. Description of the Related Art

In recent years, mobile terminal devices such as cellular phones which include a magnetic-field sensor are becoming realized. In some cases, such cellular phones have not only a function for detecting the direction but also a function for displaying the current position or the like on a map corresponding to the direction thus detected, based upon the position information from a GPS (Global Positioning System).

DISCLOSURE OF THE INVENTION

[Problems to be Solved by the Invention]

While a magnetic-field sensor detects the terrestrial magnetic field, the magnetic-field sensor is affected by the magnetic field from electronic components included in its mobile terminal device. Furthermore, in a case wherein the user carries the mobile terminal device to a place where a strong magnetic field is present, the same problem occurs. For example, even in a case wherein the user enters a building with the mobile terminal device, the magnetic-field sensor is affected by the magnetic-field component other than the terrestrial magnetic field component, due to concrete, iron, and so forth, forming the building. This leads to error of direction measurement and rotating-magnetic detection which require high precision. Accordingly, in order to extract the terrestrial magnetic field component alone, such a magnetic-field sensor needs calibration for canceling out the magnetic field other than the terrestrial magnetic field component, which are contained in the detected magnetic-field component.

SUMMARY OF THE INVENTION

The present invention has been made in view of the above problems, and accordingly, it is an object thereof to provide a technique which facilitates calibration of a magnetic-field sensor.

[Means for Solving the Problems]

A first aspect of the present invention relates to a control method of controlling a magnetic-field sensor. The method is a control method of controlling a magnetic-field sensor for detecting the three-axis components of the terrestrial magnetic-field vector. The method comprises: a step for calculating a reference coordinate point in a predetermined coordinate space by performing coordinate transformation for the three-axis components of the terrestrial magnetic field vector as a reference, and holding the reference coordinate point thus calculated; a step for acquiring the three-axis component outputs of the magnetic-field sensor with four or more attitudes; a step for performing coordinate transformation for the three-axis components thus obtained for each attitude to calculate the coordinate points in the same coordinate space as with the reference coordinate point; a step for creating a sphere on which the four or more coordinate points thus obtained are positioned, and obtaining a magnetic-field offset by calculating the distance between the center of the sphere thus created and the reference coordinate point; and a step for calibrating the magnetic-field sensor using the magnetic-field offset. The coordinate point of the center of the sphere with an radius matching the size of the terrestrial magnetic field vector may be used as the aforementioned reference coordinate point. Note that the aforementioned sphere is created based upon detection results from the magnetic-field sensor with multiple attitudes. With such a control method, the magnetic-field offset is calculated based upon the center of the sphere on which the aforementioned four or more coordinate points are positioned, thereby enabling calibration of the magnetic-field sensor with ease.

A second aspect of the present invention relates to a control method of controlling a magnetic-field sensor. The method is a control method of controlling a magnetic-field sensor for detecting the two-axis components of the terrestrial magnetic-field vector. The method comprises: a step for calculating a reference coordinate point in a predetermined coordinate space by performing coordinate transformation for the two-axis components of the terrestrial magnetic field vector as a reference, and holding the reference coordinate point thus calculated; a step for acquiring the two-axis component outputs of the magnetic-field sensor with three or more attitudes; a step for performing coordinate transformation for the two-axis components thus obtained for each attitude to calculate the coordinate points in the same coordinate plane as with the reference coordinate point; a step for creating a circle which passes through the three or more coordinate points thus obtained, and obtaining a magnetic-field offset by calculating the distance between the center of the circle thus created and the reference coordinate point; and a step for calibrating the magnetic-field sensor using the magnetic-field offset. With such a control method, the magnetic-field offset is calculated based upon the center of the circle which passes through the aforementioned three or more coordinate points, thereby enabling calibration of the magnetic-field sensor with ease.

A third aspect of the present invention relates to a control device for a magnetic-field sensor. The device is a control device of a magnetic-field sensor for detecting three-axis components of the terrestrial magnetic-field vector. The device comprises: a storage unit for holding a reference coordinate point in a predetermined coordinate space obtained by performing coordinate transformation for the three-axis components of the terrestrial magnetic field vector as a reference; and a computation unit for performing coordinate transformation for the three-axis component output of the magnetic-field sensor for each of four or more attitudes to calculate the coordinate points in the same coordinate space as with the reference coordinate point, and creating a sphere on which the four or more coordinate points thus obtained are positioned, with the computation unit obtaining a magnetic-field offset by calculating the distance between the center of the sphere thus created and the reference coordinate point, and calibrating the magnetic-field sensor using the magnetic-field offset. With such a control device, the computation unit calculates the magnetic-field offset based upon the center of the sphere on which the aforementioned four or more coordinate points are positioned, thereby enabling calibration of the magnetic-field sensor with ease.

A fourth aspect of the present invention relates to a control device for a magnetic-field sensor. The device is a control device of a magnetic-field sensor for detecting two-axis components of the terrestrial magnetic-field vector. The device comprises: a storage unit for holding a reference coordinate point in a predetermined coordinate space obtained by performing coordinate transformation for the two-axis components of the terrestrial magnetic field vector as a reference; and a computation unit for performing coordinate transformation for the two-axis component output of the magnetic-field sensor for each of three or more attitudes to calculate the coordinate points in the same coordinate space as with the reference coordinate point, and creating a circle which passes through the three or more coordinate points thus obtained, with the computation unit obtaining a magnetic-field offset by calculating the distance between the center of the circle thus created and the reference coordinate point, and calibrating the magnetic-field sensor using the magnetic-field offset. With such a magnetic-field sensor, the computation unit calculates the magnetic-field offset based upon the center of the circle which passes through the aforementioned three or more coordinate points. This realizes a mobile terminal device such as a cellular phone and so forth which includes a magnetic sensor having a function which allows calibration with ease.

A fifth aspect of the present invention relates to a mobile terminal device. The mobile terminal device comprises: a magnetic-field sensor for detecting the three-axis components of the terrestrial magnetic-field vector; and the control device of the magnetic-field sensor for detecting the three-axis components of the magnetic field according to the aforementioned aspect. With such a mobile terminal device, the magnetic-field offset is calculated based upon the center of the sphere on which the aforementioned four or more coordinate points are positioned, thereby enabling calibration of the magnetic-field sensor with ease.

A sixth aspect of the present invention relates to a mobile terminal device. The mobile terminal device comprises: a magnetic-field sensor for detecting the two-axis components of the terrestrial magnetic-field vector; and the control device of the magnetic-field sensor for detecting the two-axis components of the magnetic field according to the aforementioned aspect. With such a mobile terminal device, the magnetic-field offset is calculated based upon the center of the circle which passes through the aforementioned three or more coordinate points. This realizes a mobile terminal device such as a cellular phone and so forth which includes a magnetic sensor having a function which allows calibration with ease.

Note that any combination of the aforementioned components or any manifestation of the present invention realized by modification of a method, system, recording medium, computer program, and so forth, is effective as an embodiment of the present invention.

[Advantages]

The present invention enables calibration of a magnetic-field sensor with ease.

REFERENCE NUMERALS

Figure 1:
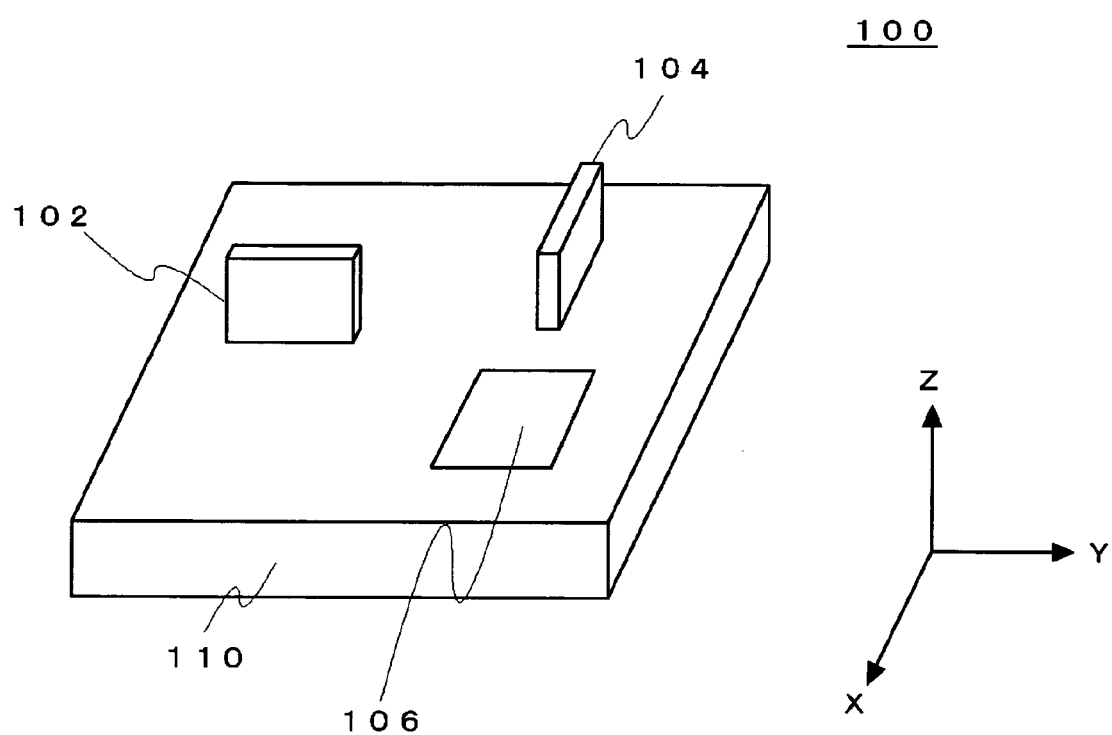
FIG. 1 is a diagram which shows an example of a magnetic-field sensor.

100: magnetic-field sensor
102: first magnetic-field detection device
104: second magnetic-field detection device
106: third magnetic-field detection device
110: substrate
120: tilt sensor
200: control device
210: computation unit
220: storage unit
230: monitoring unit
300: mobile terminal device

DETAILED DESCRIPTION OF THE INVENTION

First, before detailed description of a calibration method for canceling out the magnetic field component other than the terrestrial magnetic field component according to the present embodiment, description will be made regarding a configuration of a three-axis magnetic-field sensor which employs such a calibration method. FIG. 1 is a diagram which shows an example of a magnetic-field sensor 100. The magnetic-field sensor 100 includes at least three magnetic-field detection devices 102, 104, and 106, for detecting the three-axis components of the magnetic-field vector in the directions of X, Y, and Z. The first magnetic-field detection device 102 detects the magnetic field component in the X-axis direction. The second magnetic-field detection device 104 detects the magnetic field component in the Y-axis direction. The third magnetic-field detection device 106 detects the magnetic field component in the Z-axis direction.

With the magnetic-field sensor 100, the first magnetic-field detection device 102 and the second magnetic-field detection device 104 are preferably formed of MR (Magneto Resistance) devices, Hall devices, or MI (Magneto Impedance) devices. Furthermore, the third magnetic-field detection device 106 is preferably formed of an MR device, Hall device, or MI device. Such a configuration wherein all the magnetic-field detection devices are formed of MR devices or Hall devices, allows formation of the magnetic-field sensor 100 using a series of semiconductor manufacturing processes.

The first magnetic-field detection device 102 and the second magnetic-field detection device 104 are formed on the face of a substrate 110 with predetermined angles thereto for detecting the respective magnetic-field components parallel with the substrate face, i.e., the two-axial magnetic-field components in the X-axis direction and the Y-axis direction. Note that the first magnetic-field detection device 102 and the second magnetic-field detection device 104 are preferably formed so as to be generally erected on the face of the substrate 110. Furthermore, the first magnetic-field detection device 102 and the second magnetic-field detection device 104 are preferably disposed on the substrate 110 with the detection faces orthogonal one to another. On the other hand, the third magnetic-field detection device 106 are formed in the face of the substrate 110 for detecting the magnetic-field component orthogonal to the substrate face, i.e., the magnetic-field component in the Z-axis direction.

Each magnetic-field detection device includes a magnetic resistance film having a thin-film structure represented by a general formula (Co1-aFea)100x-y-zLxMyOz. Note that the magnetic-substance film may be formed of rare-earth elements and nano-order-size magnetic-substance metal powder with magnetic permeability of 1,000,000 le or more. Such a magnetic-field detection device can detect a magnetic field of 1 µT or more.

While description has been made regarding an arrangement wherein the magnetic-field sensor 100 is formed of the two magnetic-field detection devices 102 and 104 erected on the substrate with reference to FIG. 1, an arrangement may be made wherein two magnetic-filed detection devices are formed in the face of the substrate 110, and the remaining single magnetic-field detection device is erected on the face of substrate 110. With such an arrangement, the two magnetic-field detection devices formed in the face of the substrate 110 detect the vertical component and the horizontal component of the magnetic-field vector, and the remaining magnetic-field detection device erected thereon detects the magnetic field orthogonal to the aforementioned vertical magnetic field and horizontal magnetic field.

Note that a flux-gate magnetic-field sensor may be employed as the aforementioned magnetic-field sensor. The flux-gate magnetic-field sensor requires a coil core, leading to a somewhat large-size configuration. While this leads to no problem in a case wherein such a flux-gate magnetic-field sensor is mounted on a vehicle or the like having space sufficient for mounting thereof, layout design must be made giving consideration to the relation as to other built-in devices in a case wherein the flux-gate magnetic-field sensor is included in a small-size terminal device such as a cellular phone and so forth. From the perspective of layout design, magneto-resistance-effect devices such as MR devices, or magneto-sensitive devices such as Hall devices enables a configuration with a smaller size than with the flux-gate magnetic-field sensor. Thus, such a type of the magnetic-field sensor has the advantage of suitably being mounted on a mobile terminal device.

Figure 2:
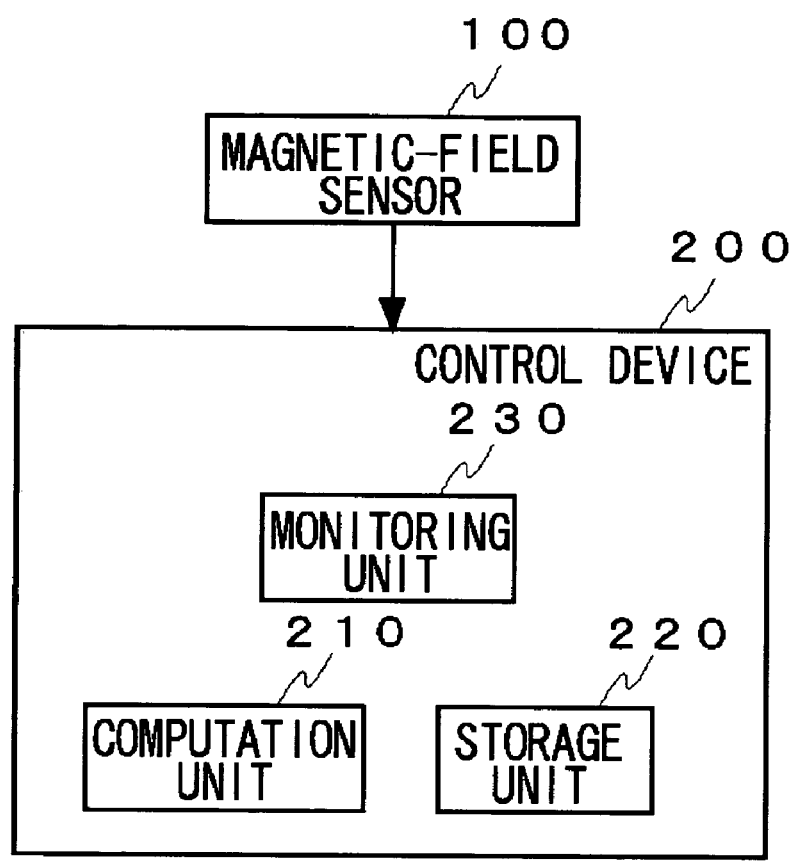
FIG. 2 is a diagram which shows a control device and a magnetic sensor according to an embodiment of the present invention.

FIG. 2 is a block diagram which shows a control device 200 and the magnetic-field sensor 100 according to an embodiment of the present invention. While the control device 200 is realized by an interfering-magnetic-field cancellation program and so forth loaded on a CPU, RAM, or ROM, of a desired computer, FIG. 2 is a functional block diagram which shows a configuration realized by cooperation thereof. It is needless to say that such a functional block configuration can be realized by hardware components alone, software components alone, or various combinations thereof, which can be readily conceived by those skilled in this art.

The control device 200 includes a computation unit 210, a storage unit 220, and a monitoring unit 230. The computation unit 210 performs computation processing described later, for calibration of the magnetic-field sensor 100. The storage unit 220 stores basic data and so forth, registered beforehand, and used as a reference for the actual output data of the magnetic-field sensor 100. In a case wherein there is no interfering magnetic field, i.e., there is no magnetic-field component other than the terrestrial magnetic field component, the outputs from the X-axis, Y-axis, and Z-axis magnetic-field detection devices of the magnetic-field sensor 100, represent the respective components of the terrestrial magnetic field. With such an arrangement, the outputs are obtained from the X-axis, Y-axis, and Z-axis magnetic-field detection devices of the magnetic-field sensor 100 with four or more attitudes while varying the attitude of the magnetic-field sensor 100. Then, the three-axis components of the output thus obtained are subjected to coordinate transformation for each attitude so as to create a sphere on which the four or more coordinate points thus obtained are positioned. The coordinate point of the center of the sphere thus created is determined as the reference coordinate point. The reference coordinate point thus determined may be registered as the aforementioned basic data. The reference coordinate point can be obtained by simulation or experiment, and the value thus obtained is registered in the storage unit 220. Note that the coordinate points positioned on the sphere, which is created with the center matching the reference coordinate point and with the radius matching the size of the terrestrial magnetic field vector, may be registered as the basic data, as well.

The monitoring unit 230 monitors the outputs from the X-axis, Y-axis, and Z-axis magnetic-field detection devices of the magnetic-field sensor 100. Note that the first magnetic-field detection device 102 of the magnetic-field sensor 100 outputs the output signals corresponding to the magnetic-field component in the X-axis direction. The second magnetic-field detection device 104 of the magnetic-field sensor 100 outputs the output signals corresponding to the magnetic-field component in the Y-axis direction. The third magnetic-field detection device 106 of the magnetic-field sensor 100 outputs the output signals corresponding to the magnetic-field component in the Z-axis direction. These output signals are input to the control device 200.

The outputs X, Y, Z, which represent the outputs corresponding to the magnetic field components in the X-axis, Y-axis, and Z-axis directions, are represented by the following Expressions.

$$X = W\{\cos(f) \cdot \cos(p) \cdot \cos(d) - \sin(f) \cdot \sin(p)\} + A$$

$$Y = W\{-\cos(f) \cdot \cos(r) \cdot \sin(d) - \cos(f) \cdot \sin(p) \cdot \sin(r) \cdot \cos(d) - \sin(f) \cdot \cos(p) \cdot \sin(r)\} + B$$

$$Z = W\{-\cos(f) \cdot \sin(r) \cdot \sin(d) + \cos(f) \cdot \sin(p) \cdot \cos(r) \cdot \cos(d) + \sin(f) \cdot \cos(p) \cdot \cos(r)\}° + C;$$

where W represents the magnetic-field intensity, f represents the dip, d represents the rotating angle, p represents the pitch angle, r represents the roll angle, A represents the interfering magnetic field component in the X-axis direction, B represents the interfering magnetic field component in the Y-axis direction, and C represents the interfering magnetic field component in the Z-axis direction. Accordingly, the magnetic-field intensity W in each of the X-axis, Y-axis, and Z-axis directions is represented by the sum of the respective component of the terrestrial magnetic field vector and the interfering magnetic field component in the corresponding axis direction.

First, let us say that there is no interfering magnetic field, i.e., there is no magnetic field other than the terrestrial magnetic field. Furthermore, let us say that the magnetic-field sensor 100 includes three-axial magnetic-field detection devices with uniform properties. Furthermore, let us say that the set of the three-dimensional coordinate points are calculated from the outputs of the X-axis, Y-axis, and Z-axis magnetic-field detection devices of the magnetic-field sensor 100 with various attitudes in the terrestrial magnetic field. In this case, the set of the three-dimensional coordinate points thus obtained are positioned on the face of a sphere created with the center matching the origin which represents magnetic-field intensity of zero, and with a radius matching the size of the terrestrial magnetic field vector.

On the other hand, in a case wherein an interfering magnetic field, i.e., a magnetic-field offset affects the magnetic-field sensor 100, the set of the points obtained while turning the magnetic-field sensor 100 in the same way as described above, are positioned on the face of an identical sphere with the same radius, except for the offset of the center of the sphere from the origin.

Figure 3:
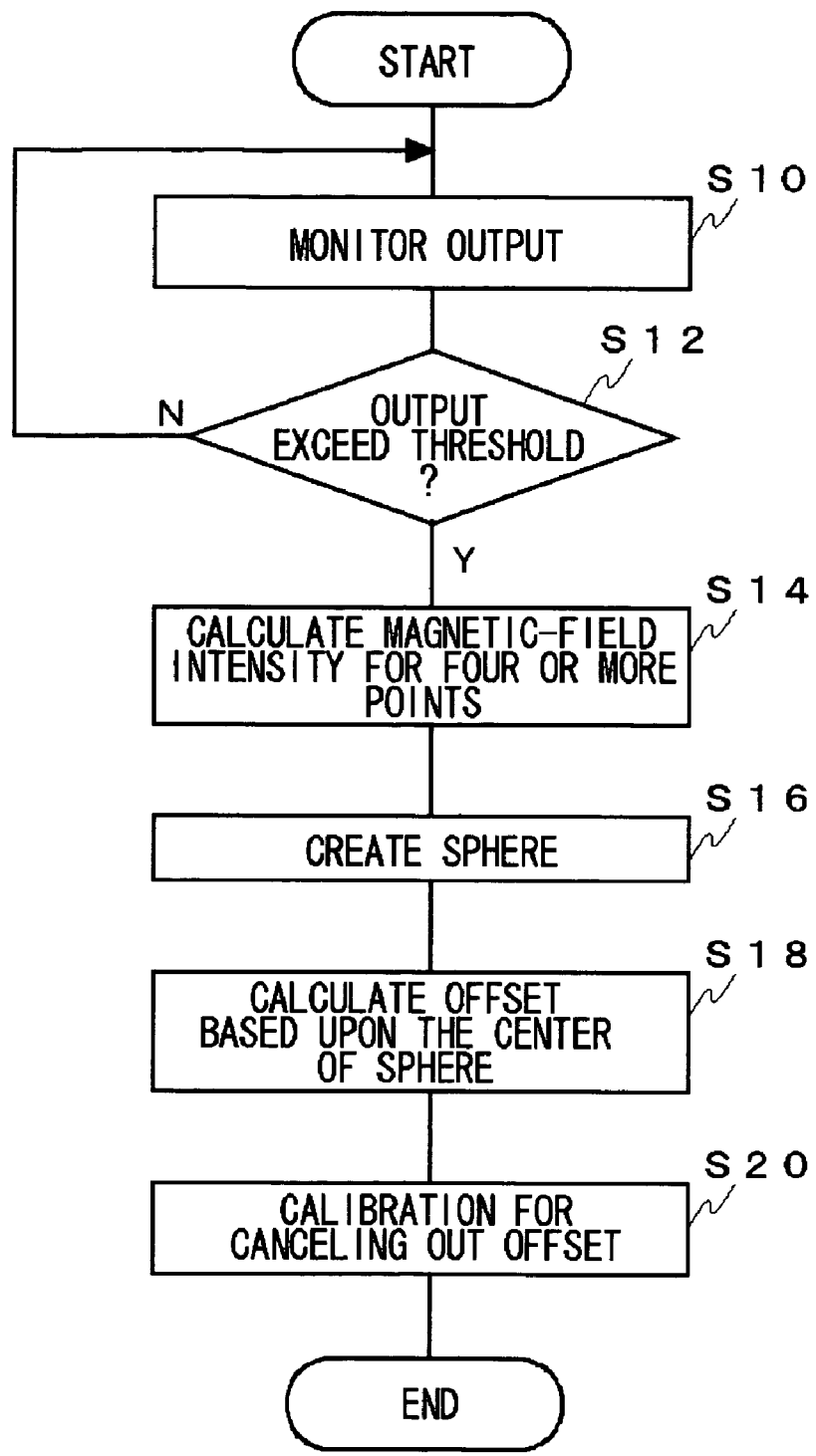
FIG. 3 is a flowchart which shows the process of calibration of the magnetic-field sensor performed by a control device according to the embodiment.

Description will be made below regarding the calibration operation of the control device 200 based upon the fact described above. FIG. 3 is a flowchart which shows the calibration operation for the magnetic-field sensor 100 by actions of the control device 200 according to the present embodiment. Upon turning on a terminal or the like including the magnetic-field sensor 100, the monitoring unit 230 monitors the output of the magnetic-field sensor 100 (S10). Then, the output is converted into a spatial coordinate point, and the coordinate point thus obtained is compared to the coordinate-point set registered in the storage unit 220 as the basic data (S12).

In a case wherein determination has been made that the difference therebetween exceeds a predetermined threshold (in a case of "YES" in S12) as a result of comparison described above, calibration processing is performed as described later. Here, the aforementioned difference may be obtained by calculating a difference between the input coordinate point and the registered coordinate point nearest thereto. On the other hand, in a case wherein the aforementioned difference does not exceed the predetermined threshold (in a case of "NO" in S12), monitoring thereof is continued (S10). Here, the predetermined threshold is used for detecting the interfering magnetic field component, i.e., the magnetic-field component other than the terrestrial magnetic field component, which may be obtained by experiment. Note that the threshold is determined based upon the degree of the permissible margin of error designed beforehand.

The computation unit 210 calculates the magnetic-field intensity based upon the output signals output from the X-axis, Y-axis, and Z-axis magnetic-field detection devices of the magnetic-field sensor 100 (S14). Such calculation is performed for four or more different points. Note that at least one point is not positioned on a plane including the other points. The Expressions for calculating the magnetic-field intensity at four different points are represented as follows.

$$W_1^2 = X_1^2 + Y_1^2 + Z_1^2$$

$$W_2^2 = X_2^2 + Y_2^2 + Z_2^2$$

$$W_3^2 = X_3^2 + Y_3^2 + Z_3^2$$

$$W_4^2 = X_4^2 + Y_4^2 + Z_4^2$$

Figure 4:
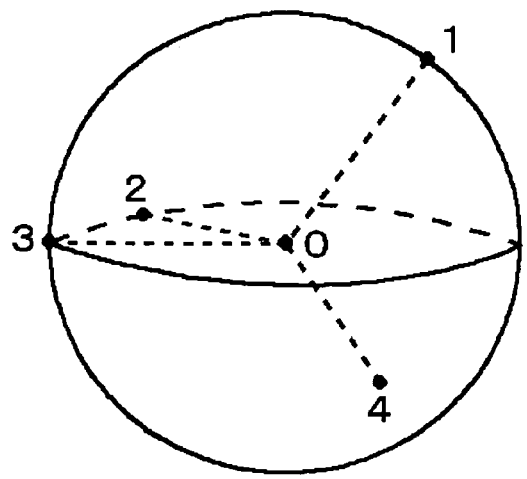
FIG. 4 is a diagram which shows an example of a sphere created by a computation unit.

Next, the computation unit 210 creates a sphere based upon the aforementioned four or more points (S16). That is to say, the output signals output from the X-axis, Y-axis, and Z-axis magnetic-field detection devices of the magnetic-field sensor 100 are converted into three-dimensional spatial coordinate points. Then, a sphere is created such that the aforementioned four or more points thus obtained are positioned on the face of the sphere. That is to say, a sphere is created such that the distance between the center and each coordinate point thus obtained is constant. Note that the aforementioned distance, i.e., the radius of the sphere represents the size of the terrestrial magnetic field vector. FIG. 4 is a diagram which shows an example of a sphere created by the computation unit 210. The center point 0 is determined such that the distance between the center point 0 and each of the points 1 through 4 is constant. It is needless to say that the sphere may be created based upon four or more points.

Then, the computation unit 210 calculates the coordinate point of the center of the sphere thus created. The coordinate point thus obtained represents the magnetic-field intensity offset (S18). The Expressions for calculating the coordinate point of the center of the sphere are represented as follows. These Expressions can be introduced based upon the aforementioned Expressions for calculating the outputs corresponding to the magnetic-field components in the X-axis, Y-axis, and Z-axis directions.

$$A = \frac{\left\{\frac{(Y_4-Y_1)(Z_4-Z_3)-(Y_4-Y_3)(Z_4-Z_1)}{(Y_4-Y_2)(Z_4-Z_3)-(Y_4-Y_3)(Z_4-Z_2)}\right\}}{2\left[\left\{\frac{(Y_4-Y_1)(Z_4-Z_3)-(Y_4-Y_3)(Z_4-Z_1)}{(Y_4-Y_2)(Z_4-Z_3)-(Y_4-Y_3)(Z_4-Z_2)}\right\}\left\{\frac{(X_4-X_3)(Z_4-Z_2)-(X_4-X_2)(Z_4-Z_3)}{(Z_4-Z_3)}\right\} + \frac{(X_4-X_1)(Z_4-Z_3)-(X_4-X_3)(Z_4-Z_1)}{(Z_4-Z_3)}\right]} \quad \text{[Expression 1]}$$

$$B = \frac{2A\left\{\frac{(X_4-X_3)(Z_4-Z_2)-(X_4-X_2)(Z_4-Z_3)}{(Z_4-Z_3)}\right\} - \frac{(Z_4-Z_2)}{(Z_4-Z_3)}(W_4^2-W_3^2)-W_2^2+W_4^2}{2\left\{\frac{(Y_4-Y_2)(Z_4-Z_3)-(Y_4-Y_3)(Z_4-Z_2)}{(Z_4-Z_3)}\right\}} \quad \text{[Expression 2]}$$

$$C = \frac{-2A(X_4 - X_3) - 2B(Y_4 - Y_3) + (W_4^2 - W_3^2)}{2(Z_4 - Z_3)} \qquad \text{[Expression 3]}$$

The computation unit 210 subtracts the interfering magnetic field intensity A, B, and C in the X-axis, Y-axis, and Z-axis directions thus obtained, from the output signals output from the X-axis, Y-axis, and Z-axis magnetic-field detection devices of the magnetic-field sensor 100, respectively. Thus, calibration is performed (S20).

With the present embodiment described above, a sphere is created based upon the output signals from the magnetic-field sensor with four or more attitudes. Then, the magnetic-field intensity offset is calculated based upon the center of the sphere thus created. Such an arrangement enables automatic canceling of the magnetic field component other than the terrestrial magnetic field component with ease. Note that such calibration does not require the user intentional operation to make a full turn of the magnetic-field sensor on the horizontal plane, and accordingly, the processing for calculating a value between the maximum value and the minimum value of the data output from the magnetic-field sensor during the full turn, and so forth. That is to say, the calibration according to the present embodiment can be made without troublesome user operation to turn the magnetic-field sensor. This allows the user to use the magnetic-field sensor without giving consideration to the interfering magnetic field. Furthermore, this enables layout design of the components of the magnetic-field sensor in manufacturing without giving consideration to the interfering magnetic field, thereby facilitating development thereof.

Figure 5:
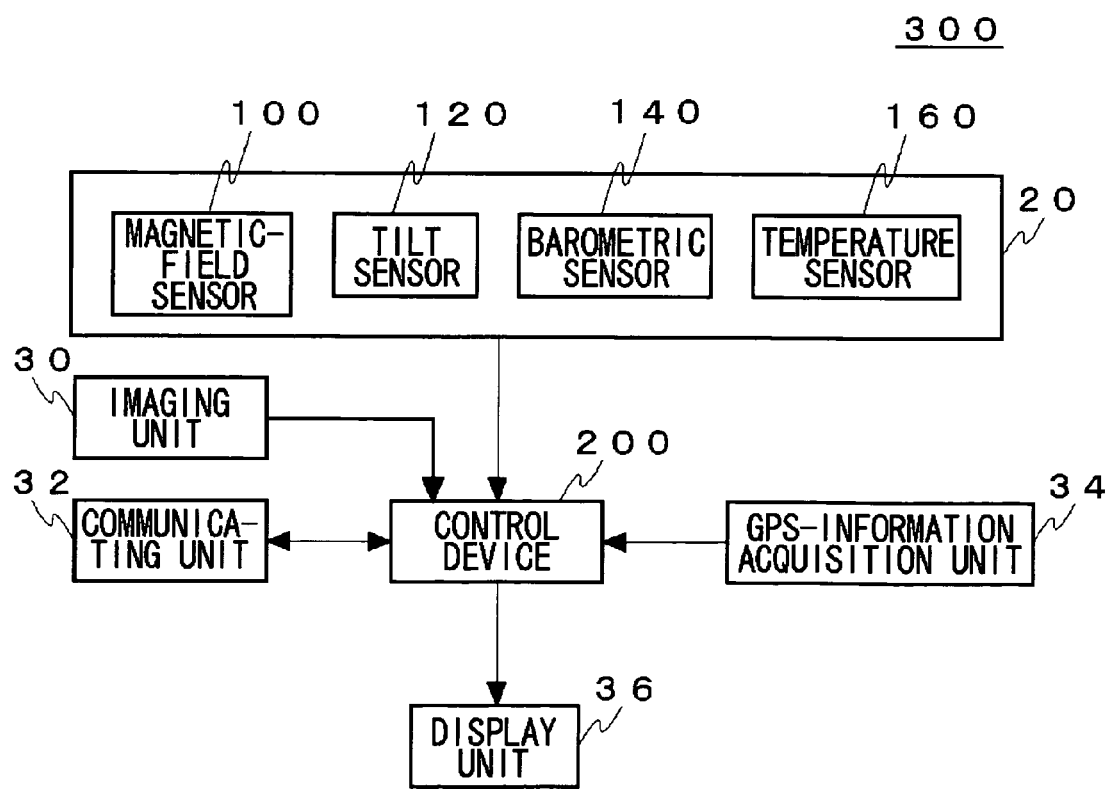
FIG. 5 is a diagram which shows a configuration of a mobile terminal device according to an embodiment of the present invention.

FIG. 5 shows a configuration of a mobile terminal device 300 according to an embodiment of the present invention. The mobile terminal device 300 is a small-size mobile electronic device such as a cellular phone, PHS (Personal Handyphone System), PDA (personal data assistant), and so forth. While FIG. 5 shows a configuration for realizing direction measurement and an application described later, the mobile terminal device 300 may include other configurations as appropriate, which can be readily conceived by those skilled in this art.

The mobile terminal device 300 includes the control device 200, a detecting unit 20, an imaging unit 30, a communicating unit 32, a GPS-information acquisition unit 34, and a display unit 36. The detecting unit 20 includes the magnetic-field sensor 100, a tilt sensor 120, a barometric sensor 140, and a temperature sensor 160. Thus, the detecting unit 20 has the functions for detecting the position, the direction, the attitude, the altitude, and so forth. The imaging unit 30 includes a photoelectric conversion device such as a CCD for acquiring an image, and transmitting the acquired image to the control device 200. The communicating unit 32 has a function for making communication with an external server either wirelessly or via cable. The GPS-information acquisition unit 34 receives position information from GPS satellites. The control device 200 calculates the current position, i.e., the latitude and the longitude of the current position, based upon the position information thus received. Note that the position information may be corrected based upon the direction information received from the magnetic-field sensor 100. This enables acquisition of the current position and direction with high precision. Furthermore, the control device 200 may use the position information and the direction information so as to correct each other. Furthermore, the control device 200 may calculate the current position and direction based upon the detection results alone received from the detecting unit 20, without using the position information received from the GPS satellites. The display unit 36 includes a display, and has a function for outputting the information processed by the control device 200 by actions of the application. Note that the mobile terminal device 300 may include an unshown speaker for giving various kinds of information to the user by audio.

The magnetic-field sensor 100 may have the configuration described above. With the present embodiment, the azimuth which is the angle as to the magnetic north, i.e., the yaw angle is calculated based upon the terrestrial magnetic field vector components in the X-axis and Y-axis directions. Note that, while the terrestrial magnetic field vector is generally parallel to the horizontal plane around the equator, the terrestrial magnetic field vector somewhat tilts at places other than the equator. Furthermore, the mobile terminal device 300 is not always positioned with an attitude parallel to the horizontal plane. Accordingly, the aforementioned terrestrial magnetic field vector must be corrected based upon the relative angles as to the direction of gravity, i.e., the pitch angle and the roll angle. Note that the pitch angle and the roll angle are detected by the tilt sensor 120. The control device 200 corrects the detection results output from the X-axis and the Y-axis magnetic-field detection devices based upon the aforementioned pitch angle and the roll angle. Specifically, the control device 200 performs aforementioned correction such that the corrected detection results output from the Z-axis magnetic-field detection device matches those which are to be obtained in the state wherein the mobile terminal device 300 is positioned with an attitude parallel to the horizontal plane. With the aforementioned arrangement, the magnetic-field sensor 100 has a function for detecting the magnetic field in the three-axial directions, and correction is performed based upon detection results output from the Z-axis detection device. Such an arrangement enables high-precision detection of the azimuth even if the attitude of the mobile terminal device 300 is greatly changed.

An acceleration sensor for detecting the acceleration components in the three-axial directions is employed as the tilt sensor 120. Examples of the acceleration sensors include: resistive acceleration sensors; capacitive acceleration sensors; piezoelectric acceleration sensors; and so forth. With the tilt sensor 120, the X-axis and the Y-axis are defined on the horizontal plane, orthogonal one to another, and the Z-axis is defined in the direction of the gravity. Upon changing the attitude of the mobile terminal device 300 to a certain tilt, the gravitational acceleration changes. The tilt sensor 120 detects the change in the gravitational acceleration, thereby detecting the pitch angle and the roll angle. Note that in the state wherein the mobile terminal device 300 is kept stationary, a tilt sensor 120 having only the two-axis acceleration sensor can detect the attitude of the mobile terminal device 300 with high precision. However, such a two-axis acceleration sensor cannot detect the precise attitude thereof due to kinetic acceleration applied to the tilt sensor 120 in a case wherein the user walks with the mobile terminal device 300, or in a case wherein the user travels with the mobile terminal device 300 by vehicle such as a bicycle, car, or the like. Even in such cases, a three-axis acceleration sensor can separate the gravity acceleration component and the kinetic acceleration component. This enables detection of the precise attitude of the mobile terminal device 300. With such an arrangement, the output values from the X-axis, Y-axis, and Z-axis acceleration detectors, are integrated so as to calculate estimation angles, and predetermined computation is performed making a comparison between the acceleration components. As a result, the precise pitch angle and roll angle are computed.

The barometric sensor 140 detects the pressure of the atmosphere, and the temperature sensor 160 detects the temperature. The detected temperature is used for correcting the deviation of the outputs of the magnetic-field sensor 100, the tilt sensor 120, and the barometric sensor 140, due to temperature drift.

Figure 6:
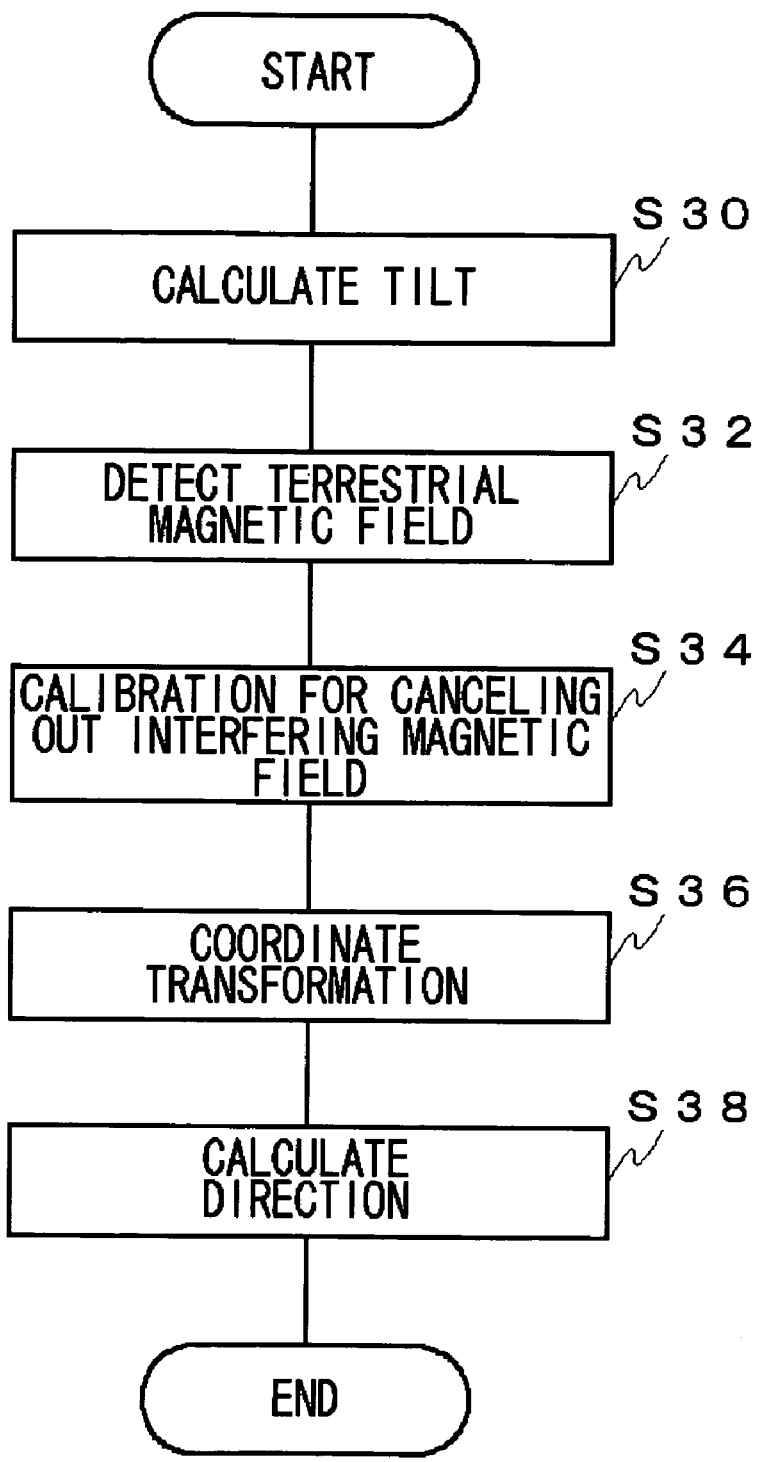
FIG. 6 is a flowchart which shows the process for calculating the direction based upon detection results received from the magnetic-field sensor and a tilt sensor.

FIG. 6 is a flowchart which shows a process for calculating the direction based upon detection results received from the magnetic-field sensor 100 and the tilt sensor 120. First, the tilt of the magnetic-field sensor 100 is calculated based upon the acceleration components in the three-axial directions detected by the tilt sensor 120 (S30). In this Step, the pitch angle and the roll angle are calculated. Then, the magnetic-field sensor 100 detects the three-axis components of the terrestrial magnetic field vector (S32). The control device 200 performs calibration described above for canceling out the interfering magnetic field (S34). Subsequently, the components of the terrestrial magnetic field vector are subjected to coordinate transformation using the pitch angle and the roll angle (S36), and the precise direction is calculated (S38). In this Step, temperature correction may be performed based upon detection results received from the temperature sensor 160. While description has been made regarding an arrangement wherein the detection results received from the tilt sensor 120 are used for calculation of the direction, various applications can be realized further using these detection results effectively.

With the present embodiment as described above, calibration corresponding to the interfering magnetic field and the tilt angle can be realized with ease. This enables high-precision output of the magnetic-field sensor.

As described above, description has been made regarding the present invention with reference to the aforementioned embodiments. The above-described embodiments have been described for exemplary purposes only, and are by no means intended to be interpreted restrictively. Rather, it can be readily conceived by those skilled in this art that various modifications may be made by making various combinations of the aforementioned components or the aforementioned processing, which are also encompassed in the technical scope of the present invention.

While description has been made in the above embodiments regarding a method for calibration corresponding to the interfering magnetic field applied to the three-axis magnetic-field sensor, the same calibration can be made for a two-axis magnetic-field sensor in a similar way. With the two-axis magnetic-field sensor, the computation unit 210 superimposes the outputs from the X-axis and Y-axis magnetic-field detection devices of the magnetic-field sensor 100 on the two-dimensional coordinate plane, and creates a circle passing through three or more different coordinate points. That is to say, the computation unit 210 creates a circle such that the distance between the center of the circle and each of the aforementioned coordinate points is constant. The magnetic-field intensity offset in the X-axis and Y-axis directions, applied to the magnetic-field sensor 100, are calculated based upon the coordinate point of the center of the circle thus obtained, and calibration is performed using the magnetic-field intensity offset thus obtained.

Description has been made in the aforementioned embodiments regarding an arrangement wherein the center of a sphere is calculated based upon four points which represent respective outputs from the magnetic-field sensor 100. Furthermore, an arrangement may be made wherein the four points are selected from five or more points which represent the outputs from the magnetic-field sensor 100, so as to suppress error of the detection results to a minimum. That is to say, an arrangement may be made wherein the four points which are as far as possible from one another are selected to calculate the center of the sphere. Furthermore, such selection may be repeated a predetermined number of times to calculate the center of the sphere. This suppresses error in the detection results due to small change in the output precision or output resolution of the magnetic-field sensor 100, and small change in the terrestrial magnetic field. This enables high-precision calibration of the magnetic-field sensor 100.

On the other hand, detection of the terrestrial magnetic field is affected by the declination depending upon the geographical location. In order to solve such a problem, an arrangement may be made wherein the declination data measured for each location beforehand is registered in the storage unit 220, and calibration is made corresponding to the declination based upon the aforementioned declination data thus registered, and the current position of the magnetic sensor 100. Here, the current position can be determined based upon the latitude-and-longitude information obtained from the time information received from the GPS satellites. Alternatively, the user may input the current position information to the mobile terminal device.

INDUSTRIAL APPLICABILITY

The present invention can be applied to the field of calibration of a magnetic-field sensor.

What is claimed is:

1. A control method of controlling a magnetic-field sensor for detecting the three-axis components of the terrestrial magnetic-field vector, said method comprising:

calculating a reference coordinate point in a predetermined coordinate space by performing coordinate transformation for the three-axis components of the terrestrial magnetic field vector as a reference, and holding said reference coordinate point thus calculated;

acquiring the three-axis component outputs of said magnetic-field sensor occurring when said sensor assumes five or more attitudes;

performing coordinate transformation for the three-axis components thus obtained for each attitude to calculate five or more coordinate points in the same coordinate space as with said reference coordinate point;

selecting four points which are as far as possible from one another among the five or more coordinate points, creating a sphere on which said selected four coordinate points are positioned, and obtaining a magnetic-field offset by calculating the distance between the center of said sphere thus created and said reference coordinate point; and calibrating said magnetic-field sensor using said magnetic-field offset.

2. A control device of a magnetic-field sensor for detecting three-axis components of the terrestrial magnetic-field vector, said device comprising:

a storage unit for holding a reference coordinate point in a predetermined coordinate space obtained by performing coordinate transformation for the three-axis components of the terrestrial magnetic field vector as a reference; and a computation unit for performing coordinate transformation for the three-axis component output of said magnetic-field sensor occurring when said sensor assumes five or more attitudes to calculate five or more coordinate points in the same coordinate space as with said reference coordinate point, selecting four coordinate points which are as far as possible from one another from among the five or more coordinate points, and creating a sphere on which said selected four coordinate points are positioned, wherein said computation unit obtains a magnetic-field offset by calculating the distance between the center of said sphere thus created and said reference coordinate point, and calibrates said magnetic-field sensor using said magnetic-field offset.

3. A mobile terminal device comprising:

a magnetic-field sensor for detecting the three-axis components of the terrestrial magnetic-field vector; and a control device according to claim 2.

4. A system for calibrating a device containing a three-axis magnetic-field sensor, said system comprising:

a storage unit for storing a reference coordinate point in a predetermined coordinate space obtained by performing coordinate transformation for the three-axis components of the terrestrial magnetic field vector; and a computation unit for:

calculating five or more coordinate points in the same coordinate space as the reference coordinate point by performing coordinate transformation for the three-axis component output of said magnetic-field sensor when said device assumes five or more attitudes;

selecting four points which are as far as possible from one another from among the five or more coordinate points;

creating a sphere on which said selected four coordinate points are positioned;

calculating a magnetic-field offset based on the distance between the center of said sphere thus created and said reference coordinate point; and calibrating said device based on said magnetic-field offset.

* * * * *